(12) United States Patent
Zhang et al.

(10) Patent No.: US 10,320,068 B2
(45) Date of Patent: Jun. 11, 2019

(54) ANTENNA AND TERMINAL

(71) Applicant: Huawei Technologies Co., Ltd., Shenzhen (CN)

(72) Inventors: Chen Zhang, Xi'an (CN); Jianming Gao, Xi'an (CN); Yibo Chen, Shenzhen (CN); Bing Liu, Xi'an (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 166 days.

(21) Appl. No.: 15/538,837

(22) PCT Filed: Dec. 22, 2014

(86) PCT No.: PCT/CN2014/094498
§ 371 (c)(1),
(2) Date: Jun. 22, 2017

(87) PCT Pub. No.: WO2016/101095
PCT Pub. Date: Jun. 30, 2016

(65) Prior Publication Data
US 2017/0352949 A1    Dec. 7, 2017

(51) Int. Cl.
*H01Q 1/38* (2006.01)
*H01Q 1/22* (2006.01)
(Continued)

(52) U.S. Cl.
CPC ............. *H01Q 1/38* (2013.01); *H01Q 1/22* (2013.01); *H01Q 1/243* (2013.01); *H01Q 5/335* (2015.01);
(Continued)

(58) Field of Classification Search
CPC .. H01Q 1/38; H01Q 9/04; H01Q 1/22; H01Q 1/243; H05K 7/1428; H05K 7/1438
(Continued)

(56) References Cited

U.S. PATENT DOCUMENTS

| 6,614,401 | B2* | 9/2003 | Onaka | H01Q 1/243 343/702 |
| 2002/0167448 | A1* | 11/2002 | Kushihi | H01Q 1/243 343/700 MS |

(Continued)

FOREIGN PATENT DOCUMENTS

| CN | 101188326 A | 5/2008 |
| CN | 101483272 A | 7/2009 |

(Continued)

OTHER PUBLICATIONS

Foreign Communication From a Counterpart Application, European Application No. 14908666.2, Extended European Search Report dated Oct. 18, 2017, 12 pages.
(Continued)

*Primary Examiner* — Hai V Tran
(74) *Attorney, Agent, or Firm* — Conley Rose, P.C.

(57) ABSTRACT

Embodiments of the present disclosure disclose an antenna, and relate to the field of wireless communications. In the antenna, radiation parts of the antenna are disposed on at least two layers of circuit boards on a printed circuit board: a top layer circuit board and a first layer circuit board, so that lengths of the radiation parts of the antenna are reduced, and space occupied by a printed wire of the antenna on the PCB is reduced. Therefore, reducing a PCB size becomes possible, a size of a terminal using the reduced-size PCB may also be correspondingly reduced, and the terminal may be further miniaturized.

20 Claims, 4 Drawing Sheets

(51) Int. Cl.
- *H01Q 9/04* (2006.01)
- *H01Q 1/24* (2006.01)
- *H05K 7/14* (2006.01)
- *H01Q 7/00* (2006.01)
- *H01Q 5/335* (2015.01)

(52) U.S. Cl.
CPC ............... *H01Q 7/00* (2013.01); *H01Q 9/04* (2013.01); *H05K 7/1428* (2013.01); *H05K 7/1438* (2013.01)

(58) Field of Classification Search
USPC .................................. 343/906, 700 MS, 702
See application file for complete search history.

(56) References Cited

U.S. PATENT DOCUMENTS

| | | | |
|---|---|---|---|
| 2008/0129604 A1* | 6/2008 | Chang | H01Q 1/2283 343/700 MS |
| 2008/0180333 A1* | 7/2008 | Martiskainen | H01Q 1/243 343/722 |
| 2010/0309087 A1* | 12/2010 | Tsai | H01Q 1/38 343/861 |
| 2011/0210898 A1* | 9/2011 | Choi | H01Q 1/243 343/749 |
| 2012/0287015 A1 | 11/2012 | Chung et al. | |
| 2014/0085159 A1 | 3/2014 | Wong et al. | |
| 2014/0111393 A1 | 4/2014 | Lo Hine Tong et al. | |
| 2014/0292601 A1 | 10/2014 | Kim et al. | |
| 2015/0380810 A1 | 12/2015 | Miura | |

FOREIGN PATENT DOCUMENTS

| | | |
|---|---|---|
| CN | 202094283 U | 12/2011 |
| CN | 103515699 A | 1/2014 |
| CN | 103700922 A | 4/2014 |
| CN | 103779657 A | 5/2014 |
| EP | 1248316 A2 | 10/2002 |
| EP | 2750249 A1 | 7/2014 |
| JP | 2010232820 A | 10/2010 |
| KR | 20110003679 A | 1/2011 |
| WO | 2012068758 A1 | 5/2012 |
| WO | 2014129147 A1 | 8/2014 |

OTHER PUBLICATIONS

Machine Translation and Abstract of Japanese Publication No. JP2010232820, dated Oct. 14, 2010, 15 pages.
Machine Translation and Abstract of Korean Publication No. KR20110003679, dated Jan. 13, 2011, 21 pages.
Foreign Communication From a Counterpart Application, Korean Application No. 2017-550970, Korean Notice and Brief Translation of Allowance dated Oct. 2, 2018, 4 pages.
Machine Translation and Abstract of Chinese Publication No. CN101483272, dated Jul. 15, 2009, 5 pages.
Machine Translation and Abstract of International Publication No. WO2012068758, dated May 31, 2012, 8 pages.
Foreign Communication From a Counterpart Application, PCT Application No. PCT/CN2014/094498, English Translation of International Search Report dated Sep. 10, 2015, 2 pages.
Foreign Communication From a Counterpart Application, PCT Application No. PCT/CN2014/094498, English Translation of Written Opinion dated Sep. 10, 2015, 6 pages.
Machine Translation and Abstract of Chinese Publication No. CN103515699, dated Jan. 15, 2014, 15 pages.
Foreign Communication From a Counterpart Application, Chinese Application No. 201480081104.8, Chinese Office Action dated Dec. 3, 2018, 9 pages.

* cited by examiner

ANTENNA AND TERMINAL

CROSS-REFERENCE TO RELATED APPLICATIONS

This application is a national stage of International Application No. PCT/CN2014/094498, filed on Dec. 22, 2014, which is hereby incorporated by reference in its entirety.

TECHNICAL FIELD

The present disclosure relates to the field of wireless communications, and in particular, to an antenna and a terminal.

BACKGROUND

In a Wireless Fidelity (Wi-Fi) environment, a terminal such as a personal computer or a hand-held device (such as a palmtop computer or a mobile phone) may access the Internet in a wireless manner. In a general Wi-Fi environment, all terminals receive Wi-Fi signals and access the Internet by using Wi-Fi antennas that are disposed on the terminals.

In general, a Wi-Fi antenna includes a printed circuit board (PCB), a feeding point, and a radiation part. The radiation part is a planar strip structure, and the radiation part is printed on the PCB. The feeding point is disposed on an end of the radiation part, and the feeding point is connected to a signal cable on the PCB. The feeding point is used to receive a to-be-transmitted Wi-Fi signal that is input by using the signal cable, and transmit the to-be-transmitted Wi-Fi signal to the radiation part. The radiation part transmits the to-be-transmitted Wi-Fi signal in a form of an electromagnetic wave, receives an external Wi-Fi signal, and then transfers the Wi-Fi signal in a form of an electric current to the feeding point. The feeding point transfers the Wi-Fi signal to the signal cable on the PCB. To ensure that the Wi-Fi antenna works at an operating frequency, the radiation part is at least 16 millimeters in length, and at least 5 millimeters in width. Therefore, space occupied by the Wi-Fi antenna on the PCB is at least more than 80 square millimeters.

In a process of implementing the present disclosure, it is found that some approaches at least have the following problem:

In general, due to a relatively long radiation part of a Wi-Fi antenna, the Wi-Fi antenna occupies relatively large space on a PCB. As a result, a size of the PCB cannot be reduced, a size of a terminal using the PCB cannot be reduced either, and the terminal cannot be further miniaturized.

SUMMARY

To resolve the problem described above, embodiments of the present disclosure provide an antenna and a terminal. Technical solutions are as follows:

In a first aspect, an embodiment of the present disclosure provides an antenna, where the antenna includes a top layer circuit board, a first layer circuit board, a first radiation part, a second radiation part, and a feeding unit, where the first radiation part and the feeding unit are printed in a cabling region of the top layer circuit board; an end of the first radiation part is connected to a first side of a copper foil region of the top layer circuit board, the feeding unit is located between the first radiation part and a second side of the copper foil region of the top layer circuit board, a gap is formed between the feeding unit and the copper foil region of the top layer circuit board, the feeding unit is not in contact with the first radiation part, the feeding unit is connected to a signal cable, the second side of the copper foil region is vertical to either of the first side and a third side that are of the copper foil region, and the first side is opposite to the third side; the second radiation part is printed in a cabling region of the first layer circuit board, and an end of the second radiation part is connected to a third side of a copper foil region of the first layer circuit board and partially overlaps with the first radiation part; and a lower surface of the top layer circuit board fits an upper surface of the first layer circuit board.

In a first possible implementation manner of the first aspect, a width of the second radiation part is greater than a width of the first radiation part.

With reference to the first aspect and the first possible implementation manner of the first aspect, in a second possible implementation manner of the first aspect, the antenna further includes a second layer circuit board and a third radiation part; where the third radiation part is printed in a cabling region of the second layer circuit board, and an end of the third radiation part is connected to a third side of a copper foil region of the second layer circuit board and partially overlaps with the second radiation part; and an upper surface of the second layer circuit board fits a lower surface of the first layer circuit board, so that the third radiation part partially overlaps with the second radiation part.

With reference to the second possible implementation manner of the first aspect, in a third possible implementation manner of the first aspect, a width of the first radiation part is equal to a width of the third radiation part.

In a fourth possible implementation manner of the first aspect, the antenna further includes a fourth radiation part, where the fourth radiation part is printed in the cabling region of the first layer circuit board; the fourth radiation part is located between a second side of the copper foil region of the first layer circuit board and the second radiation part; and an end of the fourth radiation part is connected to the second side of the copper foil region of the first layer circuit board, and a gap is formed between another end of the fourth radiation part and the second radiation part.

In a fifth possible implementation manner of the first aspect, the feeding unit includes a first feeding part, a second feeding part, and a third feeding part; where an end of the first feeding part is connected to the signal cable, and another end of the first feeding part is connected to an end of the second feeding part to form a bend; and another end of the second feeding part is connected to an end of the third feeding part to form a bend, a gap is formed between another end of the third feeding part and the second side of the copper foil region of the top layer circuit board, and the second feeding part is parallel to the first radiation part.

With reference to the fifth possible implementation manner of the first aspect, in a sixth possible implementation of the first aspect, the second side of the top layer circuit board includes a rectangular groove, the another end of the third feeding part extends to the groove, and a gap is formed between the another end of the third feeding part and a bottom of the groove.

With reference to the second possible implementation manner of the first aspect, in a seventh possible implementation manner of the first aspect, a length of each of the first radiation part, the second radiation part, and the third radiation part is between 2.25 millimeters and 4.3 millimeters.

With reference to the fifth possible implementation manner of the first aspect, in an eighth possible implementation manner of the first aspect, a length of each of the first radiation part, the second radiation part, and the third radiation part is between 1.9 millimeters and 3.8 millimeters.

In a ninth possible implementation manner of the first aspect, the antenna further includes a bottom layer circuit board, where an upper surface of the bottom layer circuit board fits a lower surface of the second layer circuit board.

In a second aspect, an embodiment of the present disclosure provides a terminal that includes the antenna described in the first aspect.

The technical solutions provided in the embodiments of the present disclosure bring the following beneficial effects:

According to the antenna and the terminal that are provided in the embodiments of the present disclosure, radiation parts of the antenna are disposed on at least two layers of circuit boards on a PCB: a top layer circuit board and a first layer circuit board, so that lengths of the radiation parts of the antenna are reduced, and space occupied by a printed wire of the antenna on the PCB is reduced. Therefore, reducing a PCB size becomes possible, a size of a terminal using the reduced-size PCB may be reduced, and the terminal may be further miniaturized.

BRIEF DESCRIPTION OF DRAWINGS

To describe the technical solutions in the embodiments of the present disclosure more clearly, the following briefly describes the accompanying drawings for describing the embodiments. The accompanying drawings in the following description show merely some embodiments of the present disclosure, and a person of ordinary skill in the art may still derive other drawings from these accompanying drawings without creative efforts.

DESCRIPTION OF EMBODIMENTS

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. The described embodiments are some but not all of the embodiments of the present disclosure. All other embodiments obtained by a person of ordinary skill in the art based on the embodiments of the present disclosure without creative efforts shall fall within the protection scope of the present disclosure.

Unless otherwise defined, a technical term or a scientific term used herein should have a general meaning understood by a person of ordinary skill in the art of the present disclosure. In the specification and claims of the patent application of the present disclosure, the terms "first", "second", and the like are not intended to indicate any order, quantity or significance, but are intended to distinguish between different components. Likewise, "a/an", "one", or the like is not intended to indicate a quantity limitation either, but is intended to indicate existing at least one. "Connection", "link" or the like is not limited to a physical or mechanical connection, but may include an electrical connection, whether directly or indirectly. "Up", "down", "left", "right" and the like are intended to indicate only a relative position relationship. When an absolute position of a described object is changed, the relative position relationship also changes correspondingly.

Figure 1:
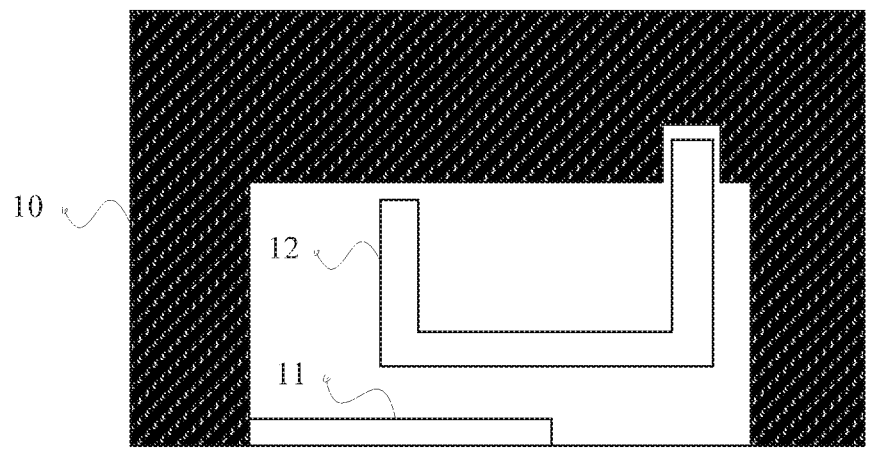
FIG. 1 is a schematic structural diagram of a top layer circuit board of an antenna according to Embodiment 1 of the present disclosure.
Figure 2:
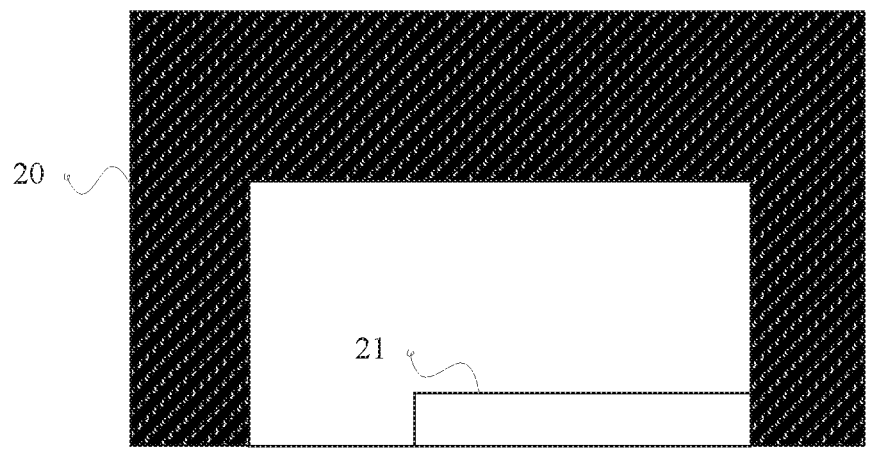
FIG. 2 is a schematic structural diagram of a first layer circuit board of an antenna according to Embodiment 1 of the present disclosure.
Figure 3:
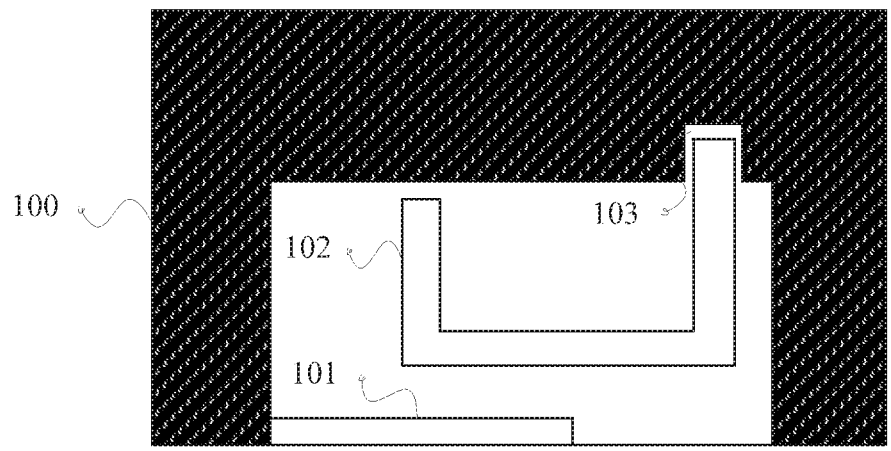
FIG. 3 is a schematic structural diagram of a top layer circuit board of an antenna according to Embodiment 2 of the present disclosure.
Figure 4:
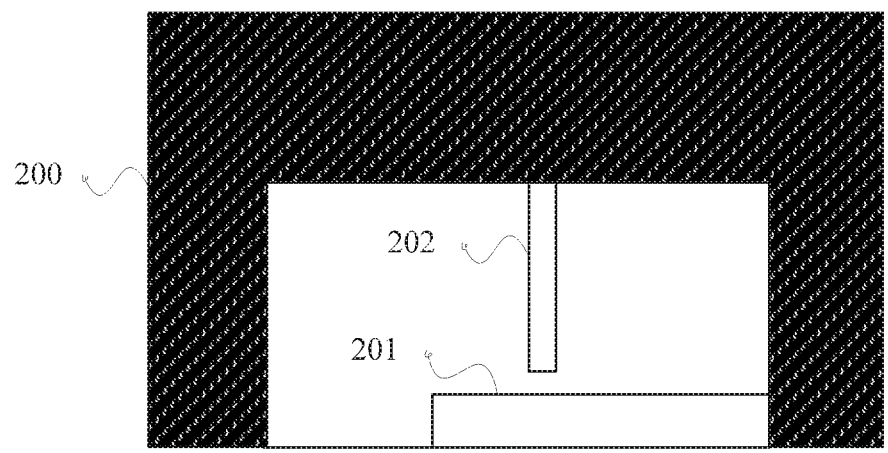
FIG. 4 is a schematic structural diagram of a first layer circuit board of an antenna according to Embodiment 2 of the present disclosure.
Figure 5:
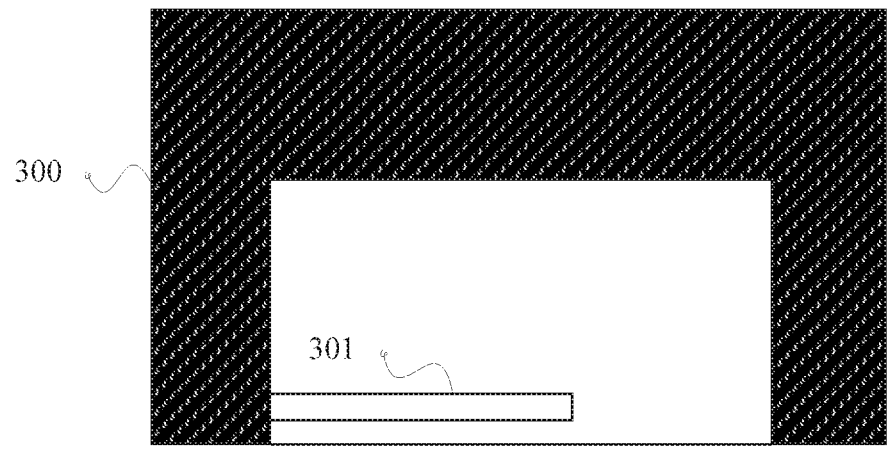
FIG. 5 is a schematic structural diagram of a second layer circuit board of an antenna according to Embodiment 2 of the present disclosure.
Figure 6:
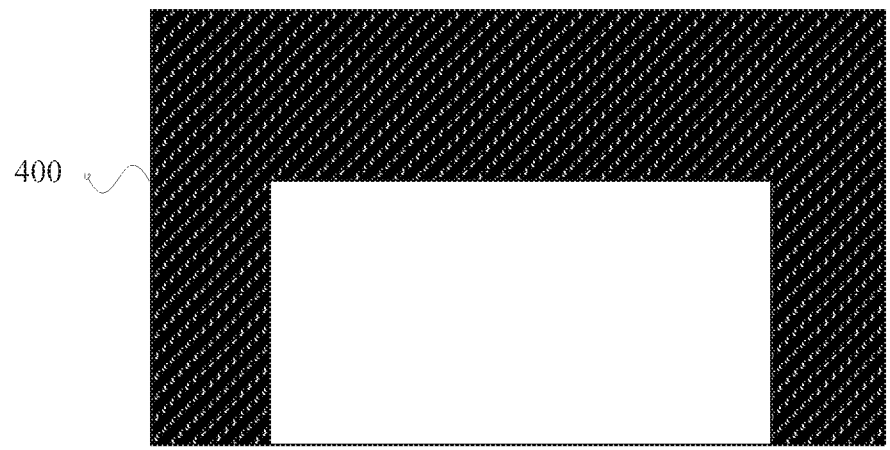
FIG. 6 is a schematic structural diagram of a bottom layer circuit board of an antenna according to Embodiment 2 of the present disclosure.
Figure 7:
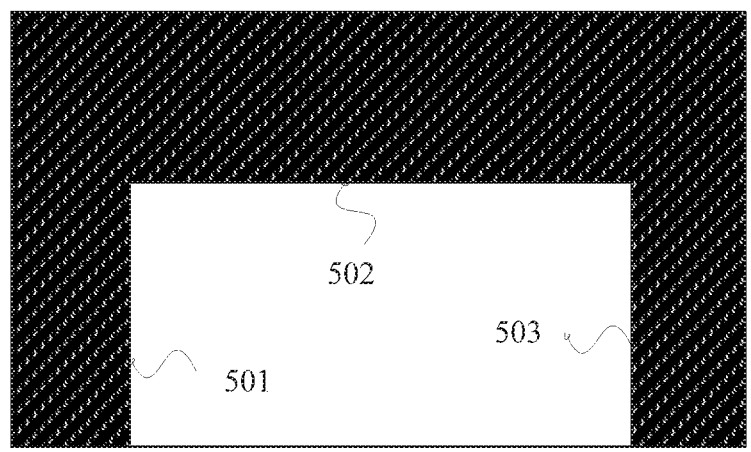
FIG. 7 is a schematic diagram of a copper foil region in an antenna according to Embodiment 2 of the present disclosure.
Figure 8:
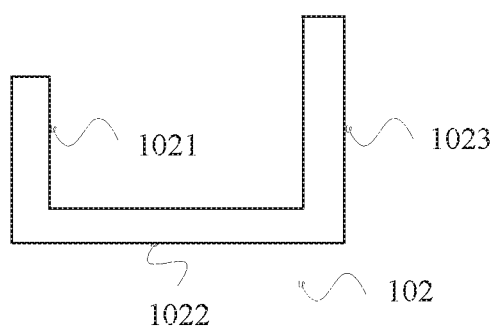
FIG. 8 is a schematic diagram of a feeding unit in an antenna according to Embodiment 2 of the present disclosure.

Referring to FIG. 1 and FIG. 2, an embodiment provides an antenna, where the antenna includes a top layer circuit board 10, a first layer circuit board 20, a first radiation part 11, a second radiation part 21, and a feeding unit 12; and the first radiation part 11 and the feeding unit 12 are printed in a cabling region of the top layer circuit board 10.

An end of the first radiation part 11 is connected to a first side of a copper foil region of the top layer circuit board 10. The feeding unit 12 is located between the first radiation part 11 and a second side of the copper foil region of the top layer circuit board 10, a gap is formed between the feeding unit 12 and the copper foil region of the top layer circuit board 10, the feeding unit 12 is not in contact with the first radiation part 11, and the feeding unit 12 is connected to a signal cable (not shown in the figure). The second side of the copper foil region is vertical to either of the first side and a third side that are of the copper foil region, and the first side is opposite to the third side.

The second radiation part 21 is printed in a cabling region of the first layer circuit board 20, and an end of the second radiation part 21 is connected to a third side of a copper foil region of the first layer circuit board 20, and partially overlaps with the first radiation part 11.

A lower surface of the top layer circuit board 10 fits an upper surface of the first layer circuit board 20.

An end of the feeding unit 12 is a feeding point, and is connected to the signal cable. A capacitive coupling is formed between another end of the feeding unit 12 and the second side of the copper foil region of the top layer circuit board.

Optionally, the signal cable is located in the top layer circuit board 10.

The cabling region of each layer circuit board is a region in which a copper foil is etched out from the circuit board.

The first radiation part 11 and the feeding unit 12 are located on an upper surface of the top layer circuit board 10, and the second radiation part 21 is located on the upper surface of the first layer circuit board 20. Alternatively, the first radiation part 11 and the feeding unit 12 are located on the lower surface of the top layer circuit board 10, and the second radiation part 21 is located on a lower surface of the first layer circuit board.

An operating principle of the antenna provided in this embodiment is as follows:

A feeding point of a feeding unit of the antenna receives a to-be-sent signal that is transferred by using a signal cable, and transfers the to-be-sent signal to another end of the feeding unit, and a capacitive coupling is formed between the another end of the feeding unit and a third side of a copper foil region of a top layer circuit board. The feeding unit transfers the to-be-sent signal in a form of an electric current to the copper foil region of the top layer circuit board through the another end that forms the capacitive coupling with the third side of the copper foil region of the top layer circuit board. Because a first radiation part is connected to the copper foil region of the top layer circuit board, the to-be-sent signal is to be transferred to the first radiation part. After the copper foil region of the top layer circuit board receives the electric current, the electric current is transferred to a copper foil region of a first layer circuit board that fits the top layer circuit board, so that a second radiation part that is connected to the copper foil region of the first layer circuit board conducts electricity and works. The second radiation part is capacitively coupled with the first radiation part by partially overlapping with the first radiation part. A presented capacitance is proportional to an area of an overlapping part between the second radiation part and the first radiation part, to match an inductance generated by the feeding unit of the antenna. Therefore, the first radiation part transmits the received to-be-transmitted signal in a form of an electromagnetic wave. When the antenna receives an external signal, the first radiation part transfers the received signal in a form of an electric current to the copper foil region of the top layer circuit board, the copper foil region of the top layer circuit board transfers the received signal to the feeding unit, and the feeding unit transfers the received signal to the signal cable on a PCB.

By using the foregoing descriptions, radiation parts of an antenna are disposed on at least two layers of circuit boards on a PCB: a top layer circuit board and a first layer circuit board, so that lengths of the radiation parts of the antenna are reduced, and space occupied by a printed wire of the antenna on the PCB is reduced. Therefore, reducing a PCB size becomes possible, a size of a terminal using the reduced-size PCB may be reduced, and the terminal may be further miniaturized.

Referring to FIG. 3 to FIG. 8, an embodiment of the present disclosure provides an antenna, where the antenna includes a top layer circuit board 100, a first layer circuit board 200, a second layer circuit board 300, a bottom layer circuit board 400, a first radiation part 101, a second radiation part 201, a third radiation unit 301, a fourth radiation unit 202, and a feeding unit 102.

Each of the first radiation part 101, the second radiation part 201, the third radiation part 301, the fourth radiation part 202, and the feeding unit 102 is a planer strip structure and printed in a cabling region of a circuit board.

The first radiation part 101 and the feeding unit 102 are printed in a cabling region of the top layer circuit board 100. An end of the first radiation part 101 is connected to a first side 501 of a copper foil region of the top layer circuit board 100. The feeding unit 102 is located between the first radiation part 101 and a second side 502 of the copper foil region of the top layer circuit board 100, a gap is formed between the feeding unit 102 and the copper foil region of the top layer circuit board 100, and the feeding unit 102 is not in contact with the first radiation part 101. The second side 502 of the copper foil region is vertical to either of the first side 501 and a third side 503 that are of the copper foil region, and the first side 501 is opposite to the third side 503.

The feeding unit 102 includes a first feeding part 1021, a second feeding part 1022, and a third feeding part 1023. All the first feeding part 1021, the second feeding part 1022, and the third feeding part 1023 are printed in the cabling region of the top layer circuit board 100.

An end of the first feeding part 1021 is a feeding point, and is connected to an internal signal cable on a PCB. Another end of the first feeding part 1021 is connected to an end of the second feeding part 1022 to form a bend.

Another end of the second feeding part 1022 is connected to an end of the third feeding part 1023 to form a bend, and the second feeding part is parallel to the first radiation part.

A gap is formed between another end of the third feeding part 1023 and the second side 502 of the copper foil region of the top layer circuit board 100.

The first feeding part 1021, the second feeding part 1022, and the third feeding part 1023 are inductively coupled to form an opening.

The second radiation part 201 is printed in a cabling region of the first layer circuit board 200, and an end of the second radiation part 201 is connected to a third side 503 of a copper foil region of the first layer circuit board 200. In addition, a projection of the first radiation part 101 in a perpendicular direction of the top layer circuit board 100 partially overlaps with the second radiation part 201 and is used to generate a capacitive coupling.

The third radiation part 301 is printed in a cabling region of the second layer circuit board 300, and an end of the third radiation part 301 is connected to a first side 501 of a copper foil region of the second layer circuit board 300. In addition, a projection of the second radiation part 201 in a perpendicular direction of the top layer circuit board 100 partially overlaps with the third radiation part 301 and is used to generate a capacitive coupling.

A lower surface of the top layer circuit board 100 fits an upper surface of the first layer circuit board 200, an upper surface of the second layer circuit board 300 fits a lower surface of the first layer circuit board 200, and an upper surface of the bottom layer circuit board 400 fits a lower surface of the second layer circuit board 300.

The first radiation part 101 and the feeding unit 102 are located on an upper surface of the top layer circuit board 100, the second radiation part 201 is located on the upper surface of the first layer circuit board 200, and the third radiation part 301 is located on the upper surface of the second layer circuit board 300. Alternatively, the first radiation part 101 and the feeding unit 102 are located on the lower surface of the top layer circuit board 100, the second radiation part 201 is located on the lower surface of the first layer circuit board 200, and the third radiation part 301 is located on the lower surface of the second layer circuit board 300.

By disposing the first radiation part, the second radiation part, and the third radiation part on the top layer circuit board, the first layer circuit board, and the second layer circuit board respectively, isolation of the antenna reaches −25 decibels within an operating frequency to have a good isolation effect, and the antenna at work may avoid interference of another antenna as much as possible.

Optionally, a thickness of each of the top layer circuit board 100, the first layer circuit board 200, and the second layer circuit board 300 may be between 0.1 millimeter and 0.2 millimeter.

The thickness of each of the top layer circuit board 100, the first layer circuit board 200, and the second layer circuit board 300 is determined according to an actual thickness of each layer board of the PCB board. Assuming that the PCB is a 5-layer board structure, a total thickness is 1 millimeter, and a thickness of each layer is 0.2 millimeter (actually, thicknesses of all layer boards are slightly different from each other), a thickness of either of the top layer circuit board and the first layer circuit board may be 0.2 millimeter, 0.4 millimeter, or 0.6 millimeter. A larger thickness indicates a smaller amount of the capacitive coupling, and a cabling width of each of the first radiation part, the second radiation part, and the third radiation part should be increased to ensure the amount of the capacitive coupling among the first radiation part, the second radiation part, and the third radiation part. An extremely large width of each radiation part goes against miniaturization of the PCB. Generally, the thickness of each of the top layer circuit board, the first layer circuit board, and the second layer circuit board may take a thickness of as much 1 or 2 layers of boards on the PCB as possible according to the actual thickness of each layer board of the PCB.

Further, the thickness of each of the top layer circuit board 100, the first layer circuit board 200, and the second layer circuit board 300 may be 0.1 millimeter, 0.15 millimeter or 0.2 millimeter.

A width of the second radiation part 201 is greater than a width of the first radiation part 101 or a width of the third radiation part 301, and the width of the first radiation part 101 is consistent with the width of the third radiation part 301.

Optionally, the width of the first radiation part 101 may be inconsistent with the width of the third radiation part 301.

Optionally, the width of the first radiation part 101 and the width of the third radiation part 301 range from 0.25 millimeter to 0.35 millimeter, and the width of the second radiation part 201 is between 0.45 millimeter and 0.6 millimeter.

Further, both the width of the first radiation part 101 and the width of the third radiation part 301 may be 0.25 millimeter, 0.3 millimeter, or 0.35 millimeter. The width of the second radiation part 201 may be 0.45 millimeter, 0.5 millimeter, 0.55 millimeter, or 0.6 millimeter.

The first radiation part 101, the second radiation part 201, and the third radiation part 301 are capacitively coupled, and a presented capacitance is proportional to an area of an overlapping part.

The capacitive coupling formed by the first radiation part 101, the second radiation part 201, and the third radiation part 301 of the antenna is used to perform impedance matching with the inductive coupling formed by the first feeding part 1021, the second feeding part 1022 and the third feeding part 1023, to make the antenna work at the operating frequency.

The capacitance obtained after the first radiation part, the second radiation part, and the third radiation part are coupled is determined by an area of an overlapping part of the first radiation part, the second radiation part, and the third radiation part. Therefore, a capacitance of the antenna may be determined by setting the width of the second radiation part. When a large capacitance is desired, a large width of the second radiation part is set to make a large area of the overlapping part of the first radiation part, the second radiation part, and the third radiation part, and the large capacitance is presented. When a small capacitance is desired, a small width of the second radiation part is set to make a small area of the overlapping part of the first radiation part, the second radiation part, and the third radiation part, and the small capacitance is presented.

A length of each of the first feeding part 1021, the second feeding part 1022, and the third feeding part 1023 is between 1.95 millimeters and 3.2 millimeters.

Optionally, the length of the first feeding part 1021 is 1.95 millimeters, the length of the second feeding part 1022 is 3.2 millimeters, and the length of the third feeding part 1023 is 2.55 millimeters.

Optionally, the length of the first feeding part 1021 is 2 millimeters, the length of the second feeding part 1022 is 3.15 millimeters, and the length of the third feeding part 1023 is 2.5 millimeters.

Optionally, the length of the first feeding part 1021 is 2.2 millimeters, the length of the second feeding part 1022 is 3.1 millimeters, and the length of the third feeding part 1023 is 2.4 millimeters.

Further, a length of each of the first radiation part 101, the second radiation part 201, the third radiation part 301, the fourth radiation part 202, the first feeding part 1021, the second feeding part 1022, and the third feeding part 1023 may respectively route another length under the condition of satisfying the operating frequency and an operating condition that are of the antenna, and details are not described herein.

It may be seen from a cabling length of each of the feeding parts and the radiation parts of the antenna that space occupied on the PCB by the antenna formed in the manner of this embodiment is generally in a range of 3 millimeters×5 millimeters, that is, space of a maximum of 15 square millimeters are occupied on the PCB, which is one-sixth of 80 square millimeters of PCB space occupied by the antenna in general. Space occupied on the PCB by the printed wire of the antenna is reduced greatly, and reducing a PCB size becomes possible.

Further, the second side of the top layer circuit board 100 includes a rectangular groove 103, another end of the third feeding part 1023 extends to the groove 103, and a gap is formed between the another end of the third feeding part 1023 and the bottom of the groove 103. The another end of the third feeding unit 1023 forms a capacitive coupling with a surrounding copper foil region by using the gap, and a presented capacitance is inversely proportional to a width of the gap.

By using the foregoing operations, the another end of the third feeding part extends to the rectangular groove 103 that is disposed in advance in the copper foil region of the top layer circuit board and forms the gap with the surrounding copper foil region. Therefore, the end of the third feeding part that extends to the groove 103 that is disposed in advance in the copper foil region of the top layer circuit board forms a capacitive coupling with the surrounding copper foil region, and further, the capacitance and the inductance that are of the antenna match an impedance to reduce the PCB space occupied by the antenna.

Further, the antenna further includes a fourth radiation part 202. The fourth radiation part 202 is printed in the cabling region of the first layer circuit board 200, and is disposed between a second side of the copper foil region of the first layer circuit board 200 and the second radiation part 201. An end of the fourth radiation part 202 is connected to the second side of the copper foil region of the first layer circuit board 200, and a gap is formed between another end of the fourth radiation part 202 and the second radiation part 201.

The fourth radiation part 202 is disposed between the second side of the copper foil region of the first layer circuit board 200 and the second radiation part 201 in a manner of being vertical to the second radiation part 201.

By disposing the fourth radiation part between the second side of the copper foil region of the first layer circuit board and the second radiation part, when the overall antenna presents a weak inductance, the fourth radiation part is used to increase and fine-tune the capacitance of the antenna, so that the capacitance of the antenna matches the inductance of the antenna, and the antenna can work at the operating frequency.

The first radiation part 101 and the feeding unit 102 are located on the upper surface of the top layer circuit board 100, the second radiation part 201 and the fourth radiation part 202 are located on the upper surface of the first layer circuit board 200, and the third radiation part 301 is located on the upper surface of the second layer circuit board 300. Alternatively, the first radiation part 101 and the feeding unit 102 are located on the lower surface of the top layer circuit board 100, the second radiation part 201 and the fourth radiation part 202 are located on the lower surface of the first layer circuit board 200, and the third radiation part 301 is located on the lower surface of the second layer circuit board 300.

A length of each of the first radiation part 101, the second radiation part 201, the third radiation part 301, and the fourth radiation part 202 is between 2.25 millimeters and 4.3 millimeters.

Optionally, the length of the first radiation part 101 is 3 millimeters, the length of the second radiation part 201 is 4.3 millimeters, the length of the third radiation part 301 is 3 millimeters, and the length of the fourth radiation part 202 is 2.25 millimeters.

Optionally, the length of the first radiation part 101 is 3.2 millimeters, the length of the second radiation part 201 is 4.1 millimeters, the length of the third radiation part 301 is 3.2 millimeters, and the length of the fourth radiation part 202 is 2.3 millimeters.

Optionally, the length of the first radiation part 101 is 2.8 millimeters, the length of the second radiation part 201 is 4.4 millimeters, the length of the third radiation part 301 is 2.9 millimeters, and the length of the fourth radiation part 202 is 2.35 millimeters.

An operating principle of the antenna provided in this embodiment is as follows:

A feeding point on a first feeding part of a feeding unit of the antenna receives a to-be-sent signal that is transferred by using a signal cable, and transfers the to-be-sent signal in a form of an electric current to an end of a third feeding part, and a capacitive coupling is formed between the end and a second side of a copper foil region of a top layer circuit board. Then the to-be-sent signal is transferred in the form of the electric current to the copper foil region of the top layer circuit board. Because a first radiation part is connected to the copper foil region of the top layer circuit board, the to-be-sent signal is to be transferred to the first radiation part. After the copper foil region of the top layer circuit board receives the electric current, the electric current is transferred to a copper foil region of the first layer circuit board that fits the top layer circuit board and a copper foil region of a second layer circuit board that fits the first layer circuit board, so that a second radiation part that is connected to the copper foil region of the first layer circuit board, and a third radiation part that is connected to the copper foil region of the second layer circuit board conduct electricity and work. Either of the first radiation part and the third radiation part is capacitively coupled with the second radiation part by partially overlapping with the second radiation part, to match an inductance generated by the feeding unit of the antenna. Therefore, the first radiation part transmits the received to-be-transmitted signal in a form of an electromagnetic wave. When the antenna receives an external signal, the first radiation part transfers the received signal in a form of an electric current to the copper foil region of the top layer circuit board, the copper foil region of the top layer circuit board transfers the received signal to the feeding unit, and the feeding unit transfers the received signal to the signal cable on a PCB.

An embodiment of the present disclosure further provides a terminal, and the terminal includes the antenna described above.

The terminal provided in this embodiment of the present disclosure may be a mobile phone, a tablet computer, a personal digital assistant, or the like.

The embodiment of the terminal in this specification is therefore described briefly. For related parts, refer to partial descriptions in the embodiment of the antenna.

According to the antenna and the terminal that are provided in the embodiments of the present disclosure, radiation parts of the antenna are disposed on at least two layers of circuit boards on a PCB: a top layer circuit board and a first layer circuit board, so that lengths of the radiation parts of the antenna are reduced, and space occupied by a printed wire of the antenna on the PCB is reduced. Therefore, reducing a PCB size becomes possible, a size of a terminal using the reduced-size PCB may be reduced, and the terminal may be further miniaturized.

The sequence numbers of the foregoing embodiments of the present disclosure are merely for illustrative purposes, and are not intended to indicate priorities of the embodiments.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. An antenna comprising:
   a top layer circuit board;
   a first layer circuit board;
   a first radiation part;
   a second radiation part; and
   a feed, wherein the first radiation part and the feed are printed in a cabling region of the top layer circuit board, wherein an end of the first radiation part is connected to a first side of a first copper foil region of the top layer circuit board, wherein the feed is located between the first radiation part and a second side of the first copper foil region, wherein a gap is formed between the feed and the first copper foil region, wherein the feed is not in contact with the first radiation part and is connected to a signal cable, wherein the second side of the first copper foil region is vertical to either of the first side and a third side of the first copper foil region and the first side of the first copper foil region is opposite the third side of the first copper foil region, wherein the second radiation part is printed in a cabling region of the first layer circuit board and an end of the second radiation part is connected to a third side of a second copper foil region of the first layer circuit board and partially overlaps with the first radiation part, and wherein a lower surface of the top layer circuit board fits an upper surface of the first layer circuit board.

2. The antenna of claim 1, wherein a width of the second radiation part is greater than a width of the first radiation part.

3. The antenna of claim 1, wherein the antenna further comprises:
    a second layer circuit board; and
    a third radiation part, wherein the third radiation part is printed in a cabling region of the second layer circuit board, wherein an end of the third radiation part is connected to a third side of a third copper foil region of the second layer circuit board and partially overlaps with the second radiation part, and wherein an upper surface of the second layer circuit board fits a lower surface of the first layer circuit board.

4. The antenna of claim 3, wherein a width of the first radiation part is equal to a width of the third radiation part.

5. The antenna of claim 3, wherein a length of each of the first radiation part, the second radiation part, and the third radiation part is between 2.25 millimeters and 4.3 millimeters.

6. The wireless terminal of claim 3, wherein a length of each of the first radiation part, the second radiation part, and the third radiation part is between 2.25 millimeters and 4.3 millimeters.

7. The antenna of claim 1, wherein the antenna further comprises a fourth radiation part, wherein the fourth radiation part is printed in the cabling region of the first layer circuit board, wherein the fourth radiation part is located between a second side of the second copper foil region and the second radiation part, wherein an end of the fourth radiation part is connected to the second side of the second copper foil region, and wherein a gap is formed between another end of the fourth radiation part and the second radiation part.

8. The antenna of claim 1, wherein the feed comprises:
    a first feeding part,
    a second feeding part, and
    a third feeding part, wherein an end of the first feeding part is connected to the signal cable and another end of the first feeding part is connected to an end of the second feeding part to form a bend, wherein another end of the second feeding part is connected to an end of the third feeding part to form a bend, wherein a gap is formed between another end of the third feeding part and the second side of the first copper foil region, and wherein the second feeding part is parallel to the first radiation part.

9. The antenna of claim 8, wherein the second side of the top layer circuit board comprises a rectangular groove, wherein the another end of the third feeding part extends to the groove, and wherein a gap is formed between the another end of the third feeding part and a bottom of the groove.

10. The antenna of claim 8, wherein a length of each of the first feeding part, the second feeding part, and the third feeding part is between 1.9 millimeters and 3.8 millimeters.

11. The wireless terminal of claim 8, wherein a length of each of the first feeding part, the second feeding part, and the third feeding part is between 1.9 millimeters and 3.8 millimeters.

12. The antenna of claim 1, wherein the antenna further comprises a bottom layer circuit board, wherein an upper surface of the bottom layer circuit board fits a lower surface of the second layer circuit board.

13. The wireless terminal of claim 1, wherein the antenna further comprises a bottom layer circuit board, and wherein an upper surface of the bottom layer circuit board fits a lower surface of the second layer circuit board.

14. A wireless terminal comprising:
    an antenna, wherein the antenna comprises:
        a top layer circuit board,
        a first layer circuit board,
        a first radiation part,
        a second radiation part, and
        a feed, wherein the first radiation part and the feed are printed in a cabling region of the top layer circuit board, wherein an end of the first radiation part is connected to a first side of a first copper foil region of the top layer circuit board, wherein the feed is located between the first radiation part and a second side of the first copper foil region, wherein a gap is formed between the feed and the first copper toil region, wherein the feed is not in contact with the first radiation part, wherein the feed is connected to a signal cable, wherein the second side of the first copper foil region is vertical to either of the first side of the first copper-oil region and a third side of the first copper foil region, and wherein the first side of the first copper foil region is opposite to the third side of the first copper foil region, wherein the second radiation part is printed in a cabling region of the first layer circuit board and an end of the second radiation part is connected to a third side of a second copper foil region of the first layer circuit board and partially overlaps with the first radiation part, and wherein a lower surface of the top layer circuit board fits an upper surface of the first layer circuit board.

15. The wireless terminal of claim 14, wherein a width of the second radiation part is greater than a width of the first radiation part.

16. The wireless terminal of claim 14, wherein the antenna further comprises:
    a second layer circuit board; and
    a third radiation part, wherein the third radiation part is printed in a cabling region of the second layer circuit board and an end of the third radiation part is connected to a third side of a third copper foil region of the second layer circuit board and partially overlaps with the second radiation part, and wherein an upper surface of the second layer circuit board fits a lower surface of the first layer circuit board.

17. The wireless terminal of claim 16, wherein a width of the first radiation part is equal to a width of the third radiation part.

18. The wireless terminal of claim 14, wherein the antenna further comprises a fourth radiation part, wherein the fourth radiation part is printed in the cabling region of the first layer circuit board and is located between a second side of the second copper foil region and the second radiation part, and wherein an end of the fourth radiation part is connected to the second side of the second copper foil region, and wherein a gap is formed between another end of the fourth radiation part and the second radiation part.

19. The wireless terminal of claim 14, wherein the feed comprises:
    a first feeding part;
    a second feeding part; and
    a third feeding part, wherein an end of the first feeding part is connected to the signal cable and another end of the first feeding part is connected to an end of the second feeding part to form a bend, wherein another end of the second feeding part is connected to an end of the third feeding part to form a bend, wherein a gap is formed between another end of the third feeding part and the second side of the first copper foil region, and wherein the second feeding part is parallel to the first radiation part.

20. The wireless terminal of claim 19, wherein the second side of the top layer circuit board comprises a rectangular groove, wherein the another end of the third feeding part extends to the groove, and wherein a gap is formed between the another end of the third feeding part and a bottom of the groove.

* * * * *

UNITED STATES PATENT AND TRADEMARK OFFICE
CERTIFICATE OF CORRECTION

PATENT NO. : 10,320,068 B2
APPLICATION NO. : 15/538837
DATED : June 11, 2019
INVENTOR(S) : Chen Zhang et al.

Page 1 of 1

It is certified that error appears in the above-identified patent and that said Letters Patent is hereby corrected as shown below:

In the Claims

Column 12, Line 18: Claim 14 "toil" should read "foil"

Column 12, Line 23: Claim 14 "oil" should read "foil"

Column 12, Line 24: Claim 14 "and wherein" should read "wherein"

Column 12, Line 56: Claim 18 "and wherein" should read "wherein"

Signed and Sealed this
Sixth Day of August, 2019

Andrei Iancu
*Director of the United States Patent and Trademark Office*